US012671316B2

(12) United States Patent
Jiang et al.

(10) Patent No.: US 12,671,316 B2
(45) Date of Patent: Jun. 30, 2026

(54) BUILT-IN RIPPLE INJECTION CIRCUIT AND CONTROL CHIP

(71) Applicant: SHANGHAI BRIGHT POWER SEMICONDUCTOR CO., LTD., Shanghai (CN)

(72) Inventors: Rulong Jiang, Shanghai (CN); Zhen Zhu, Shanghai (CN); Xiaoru Gao, Shanghai (CN); Yi Zhang, Shanghai (CN); Ge Yang, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 176 days.

(21) Appl. No.: 18/602,432

(22) Filed: Mar. 12, 2024

(65) Prior Publication Data

US 2024/0313636 A1 Sep. 19, 2024

(30) Foreign Application Priority Data

Mar. 13, 2023 (CN) .......................... 202310239440.1

(51) Int. Cl.
H02M 3/156 (2006.01)
H02M 1/14 (2006.01)
H03F 3/45 (2006.01)

(52) U.S. Cl.
CPC ........... H02M 1/143 (2013.01); H02M 3/156 (2013.01); H03F 3/45475 (2013.01); H03F 3/456 (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225;
(Continued)

(56) References Cited

U.S. PATENT DOCUMENTS 7,482,791 B2 * 1/2009 Stoichita ............... H02M 3/156
323/288
9,306,454 B2 * 4/2016 Jayaraj ................ H02M 3/1563
(Continued)

*Primary Examiner* — Jeffrey A Gblende
(74) *Attorney, Agent, or Firm* — Muncy, Geissler, Olds & Lowe, P.C.

(57) ABSTRACT

The present invention provides a built-in ripple injection circuit and a control chip, in which a divided feedback voltage is obtained by division of an output voltage by a feedback circuit, and high-frequency ripple in the output voltage is obtained by an operational amplifier and a first capacitor. Moreover, the high-frequency ripple is injected at a third terminal of a source follower. As a result, the feedback voltage is a superimposition of the divided feedback voltage with the high-frequency ripple. This can enhance stability and interference resilience of a power supply system operating in a ripple-based COT control mode. Further, the built-in ripple circuit can be integrated in the control chip. This dispenses with the use of a large capacitor and satisfactorily addresses applications requiring on-chip integration of the feedback circuit, reducing the cost of the power supply system.

9 Claims, 4 Drawing Sheets

(58) Field of Classification Search
  CPC .......... G05F 3/227; G05F 3/245; G05F 3/247;
          G05F 3/262; G05F 3/265; G05F 3/267;
        G05F 1/575; H02M 5/2573; H02M 1/081;
          H02M 5/293; H02M 7/12; H02M 3/10;
        H02M 3/125; H02M 3/13; H02M 3/135;
        H02M 3/145; H02M 3/15; H02M 3/155;
        H02M 3/156; H02M 3/157; H02M 3/158;
            H02M 1/346; H02M 3/1588; H02M
        2003/1566; H02M 3/1582; H02M 3/1584;
        H02M 2003/1557; H02M 1/0032; H02M
          1/4225; H02M 7/217; H02M 1/0025;
          H02M 1/0045; H02M 1/0009; H02M
        1/08; H02M 1/088; H02M 1/0048; H02M
        1/14; H02M 1/143; H02M 1/146; H05B
            39/048; B23K 11/24; H04B 2215/069
  See application file for complete search history.

(56) References Cited

U.S. PATENT DOCUMENTS

| | | | |
|---|---|---|---|
| 9,455,632 B1 * | 9/2016 | Hsieh .................... | H02M 3/156 |
| 11,735,234 B2 * | 8/2023 | Vimercati ............... | G11C 11/15 |
| | | | 365/207 |
| 2017/0006675 A1 * | 1/2017 | van den Broeke ..... | H02M 1/14 |
| 2020/0067407 A1 * | 2/2020 | Kashiwagi ............ | H02M 3/156 |
| 2023/0387788 A1 * | 11/2023 | Lin ....................... | H02M 1/143 |
| 2025/0183782 A1 * | 6/2025 | Morimoto ........... | H02M 1/0048 |

* cited by examiner

BUILT-IN RIPPLE INJECTION CIRCUIT AND CONTROL CHIP

CROSS-REFERENCES TO RELATED APPLICATION

This application claims the priority of Chinese patent application number 202310239440.1, filed on Mar. 13, 2023, the entire contents of which are incorporated herein by reference.

TECHNICAL FIELD

The present invention relates to the field of power supply control and, in particular, to a built-in ripple injection circuit and a control chip.

BACKGROUND

Compared with the traditional voltage control mode or current control mode, the ripple-based COT (Constant On Time) control mode does not require the use of an error amplifier and can produce a control signal from a comparison made between a ripple-based feedback voltage and a reference voltage. This control mode provides faster loop response characteristics and features a simple structure.

FIG. 1 shows a typical waveform for operation in the ripple-based COT control mode. When the feedback voltage (Vfb) drops below the reference voltage (Vref), the power transistor is turned on for a fixed period of time, causing both the output and feedback voltages to rise. When the feedback voltage again becomes lower than the reference voltage, the power transistor is turned on for another fixed period of time. In this way, the output voltage can be maintained constant.

The operating properties of a power supply system employing the ripple-based COT control mode are largely ripple-dependent. Large output capacitance will lead to low ripple in the output voltage of the power supply. In this case, even lower ripple will be present on the feedback voltage that is divided from the output voltage. This will eventually lead to operating frequency instability and poor interference resilience of the power supply system. Therefore, those skilled in the art seeks to increase ripple in the feedback voltage.

SUMMARY

It is an objective of the present invention to provide built-in ripple injection circuit and a control chip, which overcomes the problem of low ripple on the feedback voltage in the conventional COT control mode.

To this end, the present invention provides a built-in ripple injection circuit, which is integrated within a control chip and includes:

a feedback circuit including: a first terminal for receiving an output voltage; a grounded second terminal; and an output terminal for outputting a divided feedback voltage;

an operational amplifier including a first input terminal, which is connected to the output terminal of the feedback circuit and configured to receive the divided feedback voltage;

a first capacitor including: a first terminal connected to the first terminal of the feedback circuit; and a second terminal, which is connected to an output terminal of the operational amplifier and configured to couple high-frequency ripple in the output voltage to the output terminal of the operational amplifier; and a source follower including: first terminal connected to the output terminal of the operational amplifier; a second terminal connected to the first terminal of the first capacitor; and a third terminal, which is connected to a second input terminal of the operational amplifier and configured to output a feedback voltage.

Optionally, the built-in ripple injection circuit may include a second capacitor including: a first terminal connected to the output terminal of the operational amplifier; and a grounded second terminal.

Optionally, in the built-in ripple injection circuit, a ratio of the capacitance of the first capacitor to the capacitance of the second capacitor may be between 1:5 and 5:1.

Optionally, in the built-in ripple injection circuit, the operational amplifier may be an operational transconductance amplifier with a gain between 10 nS and 250 nS.

Optionally, in the built-in ripple injection circuit, the gain of the operational transconductance amplifier may be positively correlated with the capacitance of the first capacitor.

Optionally, in the built-in ripple injection circuit, a ratio of the gain of the operational transconductance amplifier to the capacitance of the first capacitor may be between 5 nS/pF and 30 nS/pF.

Optionally, in the built-in ripple injection circuit, the feedback circuit may include a first resistor and a second resistor, a first terminal of the first resistor connected to the first terminal of the feedback circuit, a second terminal of the first resistor and a first terminal of the second resistor both connected to the output terminal of the feedback circuit, a second terminal of the second resistor connected to the second terminal of the feedback circuit.

Optionally, the built-in ripple injection circuit may further include a current source including: a first terminal connected to the third terminal of the source follower; and a grounded second terminal.

Optionally, in the built-in ripple injection circuit, the operational amplifier may be a folded cascode amplifier with negative feedback at its source.

The present invention also provides a control chip, including the built-in ripple injection circuit as defined above and another operational amplifier.

The other operational amplifier may include: a first input terminal for receiving a reference voltage; a second input terminal, which is coupled to the third terminal of the source follower and configured to receive the feedback voltage; and an output terminal for outputting a control signal.

In the built-in ripple injection circuit and the control chip of the present invention, the divided feedback voltage is obtained from division of the output voltage by the feedback circuit, and the high-frequency ripple in the output voltage is directly superimposed by the operational amplifier and first capacitor at the output terminal of the operational amplifier. As a result, in addition to a DC value that is equal to the divided feedback voltage, the feedback voltage Vfb also includes the high-frequency ripple. This can enhance stability and interference resilience of a power supply system operating in the ripple-based COT control mode. The built-in ripple injection circuit of the present invention dispenses with the use of a large capacitor. This enables it to be integrated into the control chip and satisfactorily addresses applications requiring on-chip integration of the feedback circuit, reducing the cost of the power supply system.

In these figures, 10 denotes a feedback circuit; 20, a source follower; A1, a first op amp; C11, a first capacitor; C12, a second capacitor; R11, a first resistor; R12, a second resistor; T1, a semiconductor switch; I1, a current source; R21, a first resistor; R22, a second resistor; R23, a third resistor; C21, a capacitor; A2, a second op amp;

100, a first gain profile; and 110, a second gain profile.

DETAILED DESCRIPTION

The error amplifier and power supply proposed herein will be described in greater detail below with reference to specific embodiments and to the accompanying drawings. From the following description, advantages and features of the present invention will become more apparent. Note that the figures are provided in a very simplified form not necessarily drawn to exact scale and for the only purpose of facilitating easy and clear description of the embodiments.

The terminology used herein is for the purpose of describing particular embodiments only and is not intended to be limiting of the invention. Unless defined otherwise herein, all technical and scientific terms used herein have the same meaning as commonly understood by one of ordinary skill in the art to which the invention belongs. As used herein and in the appended claims, the terms "first," "second," and the like do not denote any order, quantity, or importance, but rather are used to distinguish one element from another. Likewise, the terms "a" and "an" do not denote a limitation of quantity, but rather denote the presence of at least one of the referenced items. The terms "plurality" or "several" means two or more than two. Unless defined otherwise herein, the terms "front", "rear", "lower", "upper" and/or the like are merely for ease of description, and should not be construed as being limited to a particular position, or to a particular spatial orientation. The use of "including" or "comprising" or the like herein is meant to encompass the elements or items listed thereafter and equivalents thereof but do not preclude the presence of other elements or items. The terms "connected", "coupled" or the like are not restricted to physical or mechanical connections or couplings, and can include electrical connections or couplings, whether direct or indirect. As used herein and in the appended claims, the singular forms "a", "an", and the" are intended to include the plural forms as well, unless the context clearly indicates otherwise. It will be also understood that, as used herein, the term "and/or" includes any and all combinations of one or more of the associated listed items.

Figure 1:
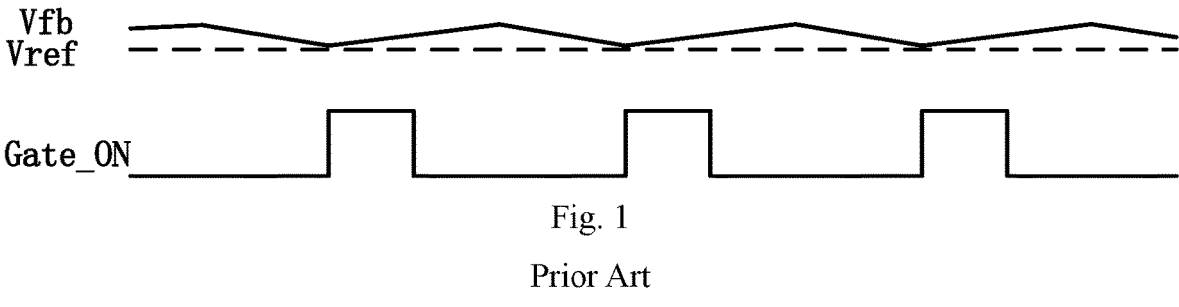
FIG. 1 shows a typical waveform for operation in the ripple-based COT control mode.
Figure 2:
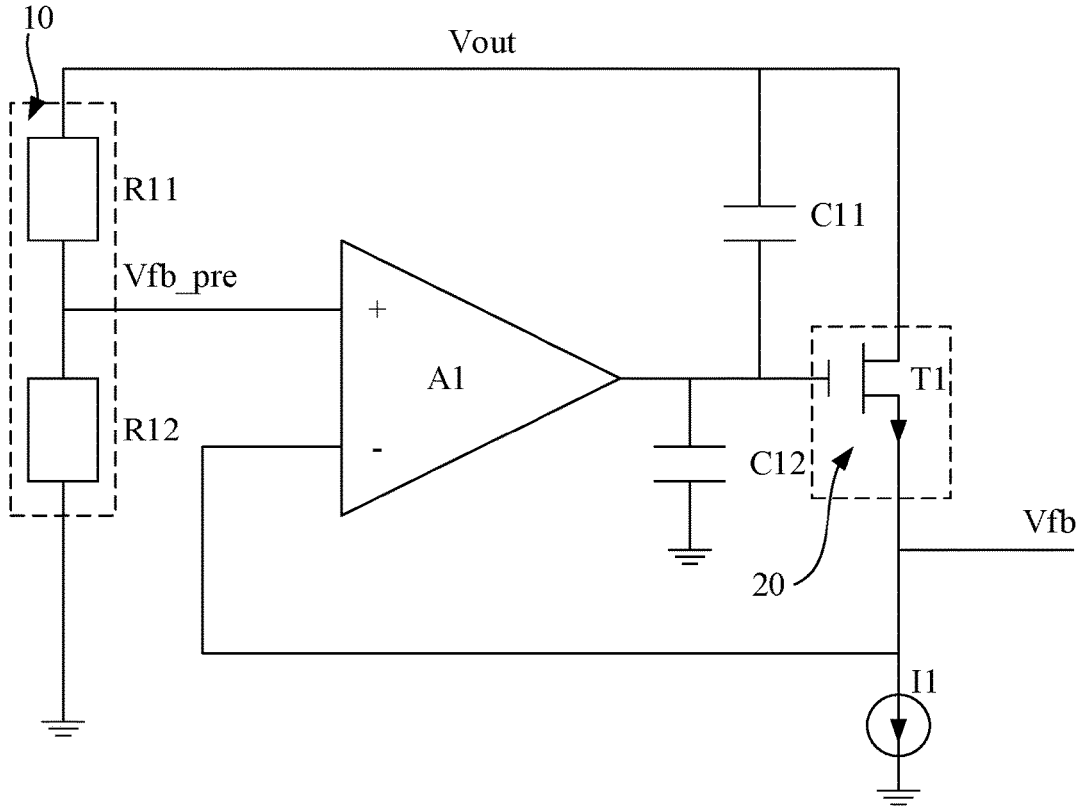
FIG. 2 is a schematic circuit diagram of a built-in ripple injection circuit according to an embodiment of the present invention.

FIG. 2 is a schematic circuit diagram of a built-in ripple injection circuit according to an embodiment of the present invention. As shown in FIG. 2, according to embodiments of the present application, the built-in ripple injection circuit may include a feedback circuit 10, an operational amplifier (op amp, referred to as the first op amp A1, in order to distinguish from another op amp described below), a first capacitor C11 and a source follower 20. A first terminal of the feedback circuit 10 may be configured to receive an output voltage Vout, and a second terminal of the feedback circuit 10 may be grounded. An output terminal of the feedback circuit 10 may be configured to output a divided feedback voltage Vfb_pre. According to embodiments of the present application, the feedback circuit 10 may be connected in parallel to an output terminal of a power supply and configured to receive the output voltage Vout. A first input terminal of the first op amp A1 may be connected to the output terminal of the feedback circuit 10 and configured to receive the divided feedback voltage Vfb_pre. A first terminal of the first capacitor C11 may be connected to the first terminal of the feedback circuit 10, and a second terminal of the first capacitor C11 may be connected to an output terminal of the first op amp A1, thereby coupling high-frequency ripple in the output voltage Vout to the output terminal of the first op amp A1. A first terminal of the source follower 20 may be connected to the output terminal of the first op amp A1. A second terminal of the source follower 20 may be connected to the first terminal of the first capacitor C11. A third terminal of the source follower 20 may be connected to a second input terminal of the first op amp A1 and configured to output a feedback voltage Vfb. The feedback voltage Vfb may be a superimposition of the divided feedback voltage Vfb_pre with the high-frequency ripple. That is, in addition to a DC value that is equal to the divided feedback voltage Vfb_pre, the feedback voltage Vfb also includes the high-frequency ripple. The first and second input terminals of the first op amp A1 may be non-inverting and inverting input terminals thereof, respectively. In alternative embodiments, the first and second input terminals of the first op amp A1 may be the inverting and non-inverting input terminals thereof, respectively.

According to embodiments of the present application, the divided feedback voltage Vfb_pre may be obtained from division of the output voltage Vout by the feedback circuit 10, and the high-frequency ripple in the output voltage Vout may be obtained by the first capacitor C11 and the first op amp A1 and superimposed, i.e., injected, at the third terminal of the source follower 20. In this way, the feedback voltage Vfb is a superimposition of the divided feedback voltage Vfb_pre with the high-frequency ripple. That is, in addition to a DC value of the feedback voltage Vfb is equal to the divided feedback voltage Vfb_pre, the feedback voltage Vfb also includes the high-frequency ripple. This can enhance stability and interference resilience of a power supply system operating in the ripple-based COT control mode.

According to embodiments of the present application, the first op amp A1 and the first capacitor C11 may function equivalently to a high-pass filter, which can acquire the high-frequency ripple in the output voltage Vout and superimpose it at the output terminal of the first op amp A1, increasing ripple at the third terminal of the source follower 20. In this way, the feedback voltage includes both a DC value that is equal to the divided feedback voltage Vfb_pre and the high-frequency ripple. This can improve stability and interference resilience of a power supply system.

Preferably, the capacitance of the first capacitor C11 may lie between 1 pF and 100 pF, for example, the capacitance of the first capacitor C11 may be 4 pF, 8 pF, 9 pF, 13 pF, 50 pF, 62 pF, 75 pF or the like. In alternative embodiments, the capacitance of the first capacitor C11 may be smaller than 1 pF, or greater than 100 pF. Here, the capacitance of the first capacitor C11 is relatively small. This can facilitate integration of the built-in ripple injection circuit in a control chip of a power supply system, reducing the overall cost of the power supply system.

According to embodiments of the present application, the first op amp A1 may be an operational transconductance amplifier (OTA). Preferably, the OTA may have a gain Gm lying between 10 nS and 250 nS, e.g., 30 nS, 50 nS, 60 nS, 80 nS, 150 nS, 200 nS or the like. That is, the gain Gm of the OTA is relatively low. In particular, the low-gain (Gm) OTA may be a folded cascode amplifier with negative feedback at its source. The negative feedback at the source of the folded cascode amplifier may be provided with large resistance, which can effectuate the low gain Gm.

The gain of the OTA may be positively correlated with the capacitance of the first capacitor C11. The first op amp A1 may have a bandwidth approximately of Gm/c11, where c11 denotes the capacitance of the first capacitor C11. Thus, with the low gain Gm, a low bandwidth can be achieved with low capacitance. In other words, the gain Gm of the OTA may be selected as a small value in the aforementioned range thereof, and the capacitance of the first capacitor C11 may be accordingly selected as a small value in the aforementioned range thereof. Alternatively, the gain Gm of the OTA may be selected as a large value in the aforementioned range thereof, and the capacitance of the first capacitor C11 may be accordingly selected as a large value in the aforementioned range thereof. In this way, the OTA and the first capacitor C11 can cooperate to provide a filter with an appropriate bandwidth.

Preferably, a ratio of the gain Gm of the OTA to the capacitance of the first capacitor C11 may lie between 5 nS/pF and 30 nS/pF. Accordingly, the equivalent high-pass filter provided by the OTA and the first capacitor C11 may have a bandwidth between 5 dB and 30 dB. The capacitance of the first capacitor C11 may be related to the gain Gm of the OTA and the bandwidth. For example, the gain Gm of the OTA may be 60 nS, and the capacitance of the first capacitor C11 may be 4 pF. Accordingly, the ratio of the gain Gm of the OTA to the capacitance of the first capacitor C11 is 15 nS/pF. As another example, the gain Gm of the OTA may be 72 nS, and the capacitance of the first capacitor C11 may be 6 pF. Accordingly, the ratio of the gain Gm of the OTA to the capacitance of the first capacitor C11 is 12 nS/pF.

Here, a high-pass filter with a rather low bandwidth is obtained from small capacitance of the first capacitor C11 and a low gain Gm of the OTA. In this way, not only an equivalent high-pass filter with a desirable bandwidth can be provided, but the circuit can also be easily integrated into a control chip of a power supply system. Preferably, frequencies in the bandwidth of the equivalent high-pass filter may be lower than an operating frequency of the control chip of the power supply system. Thus, the source follower can serve as a buffer, which can superimpose the high-frequency ripple in the output voltage Vout at the output terminal of the first op amp A1. In this way, in addition to a DC value that is equal to the divided feedback voltage, the feedback voltage also includes the high-frequency ripple.

With continued reference to FIG. 2, according to embodiments of the present application, the built-in ripple injection circuit may further include a second capacitor C12. A first terminal of the second capacitor C12 may be connected to the output terminal of the first op amp A1, and a second terminal of the second capacitor C12 may be grounded. Here, through the second capacitor C12, a fraction of the high-frequency ripple can be superimposed at the output terminal of the first op amp A1 and adjusted so that the feedback voltage includes both a DC value that is equal to the divided feedback voltage and the high-frequency ripple. Specifically, when only the first capacitor C11 is included, the high-frequency ripple in the output voltage Vout will be all superimposed at the third terminal of the source follower 20. When both the first capacitor C11 and the second capacitor C12 are included, a ratio of the capacitance of the first capacitor C11 to the capacitance of the second capacitor C12 can be adjusted to enable an adjustable fraction of the high-frequency ripple in the output voltage Vout to be superimposed at the third terminal of the source follower 20.

Preferably, the ratio of the capacitance of the first capacitor C11 to the capacitance of the second capacitor C12 may lie between 1:5 and 5:1. Accordingly, the capacitance of the second capacitor C12 may lie between 0.2 pF and 500 pF. In this way, the fraction of the high-frequency ripple in the output voltage Vout superimposed at the output terminal of the first op amp A1 may be adjusted between ⅙ and ⅚. This enable better control of the output voltage Vout by means of the feedback voltage Vfb, resulting in improvements in operating frequency stability and interference resilience of a power supply system.

With continued reference to FIG. 2, according to embodiments of the present application, the feedback circuit 10 may include a first resistor R11 and a second resistor R12. A ratio of the resistance of the first resistor R11 to the resistance of the second resistor R12 may lie between 1:1 and 10:1. A first terminal of the first resistor R11 may be connected to the first terminal of the feedback circuit 10. A second terminal of the first resistor R11 and a first terminal of the second resistor R12 may be both connected to the output terminal of the feedback circuit 10. A second terminal of the second resistor R12 may be connected to the second terminal of the feedback circuit 10. Preferably, the resistance of the first resistor R11 may lie between 10 kΩ and 200 kΩ. Accordingly, the resistance of the second resistor R12 may lie between 1 kΩ and 20 kΩ.

Further, the source follower 20 may include a semiconductor switch T1, which may be a MOS transistor, for example. A control terminal of the semiconductor switch T1 may be connected to the first terminal of the source follower 20. A source terminal of the semiconductor switch T1 may be connected to the second terminal of the source follower 20. A drain terminal of the semiconductor switch T1 may be connected to the third terminal of the source follower 20. The built-in ripple injection circuit may further include a current source I1. A first terminal of the current source I1 may be connected to the third terminal of the source follower 20, and a second terminal of the current source I1 may be grounded.

In summary, in the built-in ripple injection circuit provided in embodiments of the present application, the divided feedback voltage may be obtained from division of the output voltage by the feedback circuit, and the high-frequency ripple in the output voltage may be obtained by the op amp and the first capacitor. Moreover, the high-frequency ripple may be superimposed at the output terminal of the op amp. In this way, in addition to a DC value of the feedback voltage Vfb is equal to the divided feedback voltage, the feedback voltage Vfb also includes the high-frequency ripple. This can enhance stability and interference resilience of a power supply system operating in the ripple-based COT control mode.

Figure 4:
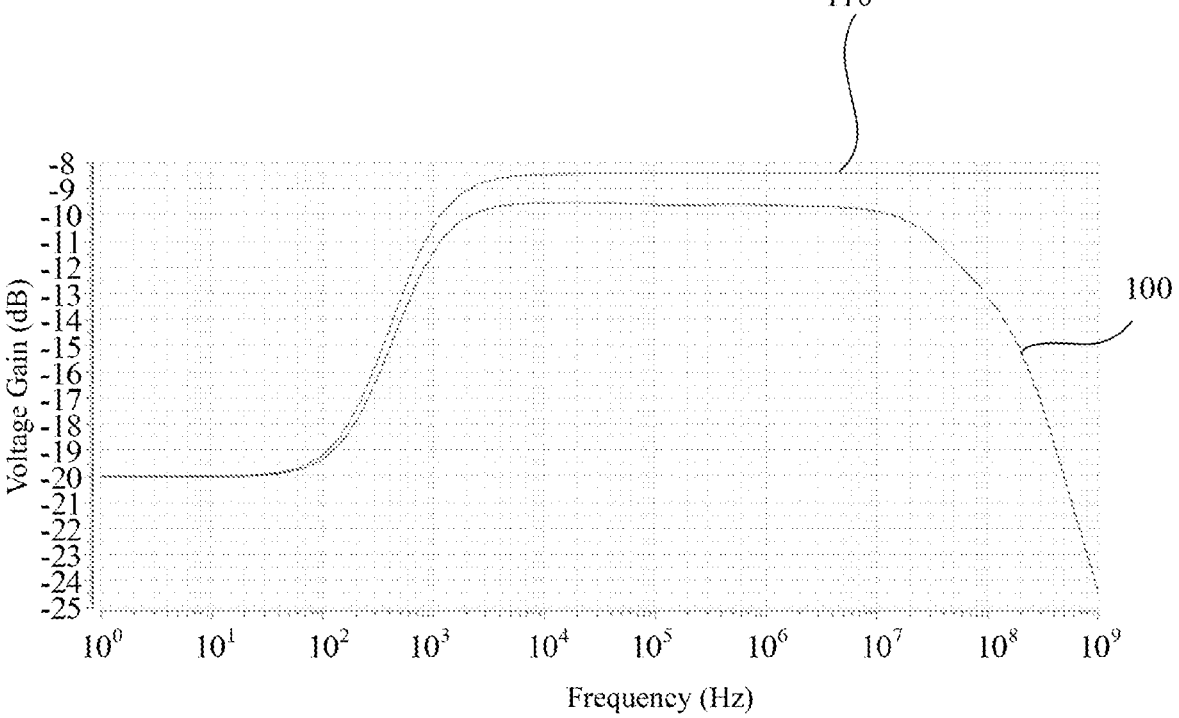
FIG. 4 schematically illustrates a simulated gain profile of an output to feedback voltage of the built-in ripple injection circuit of FIG. 2 and a simulated gain profile of an output to feedback voltage of the external ripple injection circuit of FIG. 3.

FIG. 4 schematically illustrates a simulated gain profile of the output to feedback voltage of the built-in ripple injection circuit of FIG. 2 according to embodiments of the present application. In order to better explain the benefits of the built-in ripple injection circuit according to embodiments of the present application, FIG. 4 also illustrates a simulated gain profile of an output to feedback voltage of an external ripple injection circuit.

Figure 3:
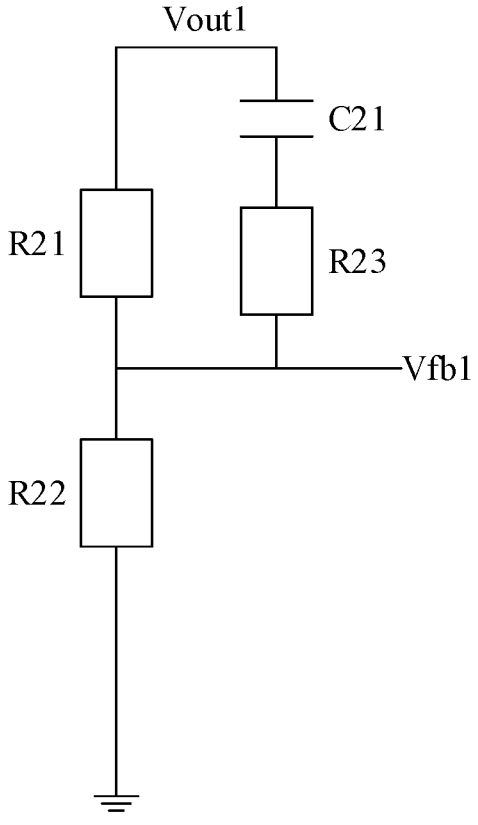
FIG. 3 is a schematic circuit diagram of an external ripple injection circuit.

Specifically, reference is made to FIG. 3, a schematic circuit diagram of an external ripple injection circuit. As shown in FIG. 3, the external ripple injection circuit may include a first resistor R21, a second resistor R22, a third resistor R23 and a capacitor C21. A first terminal of the first resistor R21 may be configured to receive an output voltage Vout1. A second terminal of the first resistor R21 may be coupled to a first terminal of the second resistor R22. A second terminal of the second resistor R22 may be grounded. A first terminal of the capacitor C21 may be connected to the first terminal of the first resistor R21. A first terminal of the third resistor R23 may be connected to a second terminal of the capacitor C21. A second terminal of the third resistor R23 may be connected to the second terminal of the first resistor R21 and configured to output a feedback voltage Vfb1. Here, the first resistor R21 and the second resistor R22 may form a feedback circuit for determining a direct current (DC) voltage-dividing ratio for the output voltage Vout1, which may be used to derive a divided feedback voltage. The third resistor R23 and the capacitor C21 may determine high-frequency ripple to be superimposed at the second terminal of the third resistor R23, which may be used to derive the feedback voltage Vfb1.

In FIG. 4, the simulated gain profile of the output voltage Vout1 to the feedback voltage Vfb1 of the external ripple injection circuit is shown as a second gain profile 110. As can be seen from FIG. 4, this gain profile of the output voltage Vout1 to the feedback voltage Vfb1 represents a characteristic behavior of a high-pass filter. The gain of the output voltage Vout1 to the feedback voltage Vfb1 is determined by the first resistance R21 and the second resistance R22 in a low frequency range, and by the third resistance R23 and the second resistance R22 in a high frequency range. When a bandwidth of the high-pass filter is low enough, a switching frequency dependent ripple on the output voltage Vout1 will be a high-frequency signal, which will be superimposed at the second terminal of the third resistor R23 at an even higher gain, achieving ripple injection.

Further, in FIG. 4, the simulated gain profile of the output voltage Vout to the feedback voltage Vfb of the built-in ripple injection circuit according to embodiments of the present application is shown as a first gain profile 100. As can be seen from FIG. 4, this gain profile of the output voltage Vout to the feedback voltage Vfb also represents a characteristic behavior of a high-pass filter. As can be seen from FIG. 4, within a frequency range below about 10 MHZ, the first gain profile 100 is substantially coincident with the second gain profile 110. In practical use, switching frequencies of power supply management systems are all lower than 10 MHz. Therefore, the built-in ripple injection circuit according to embodiments of the present application can provide the same effect, as the external ripple injection circuit of FIG. 3, of injecting high-frequency ripple to the feedback voltage to improve stability and interference resilience of a power supply system operating in the ripple-based COT control mode. The built-in ripple injection circuit according to embodiments of the present invention dispenses with the use of a large capacitor, resulting in an area reduction. This enables it to be integrated into a control chip and satisfactorily addresses applications requiring on-chip integration of the feedback circuit, reducing the cost of the power supply system.

Figure 5:
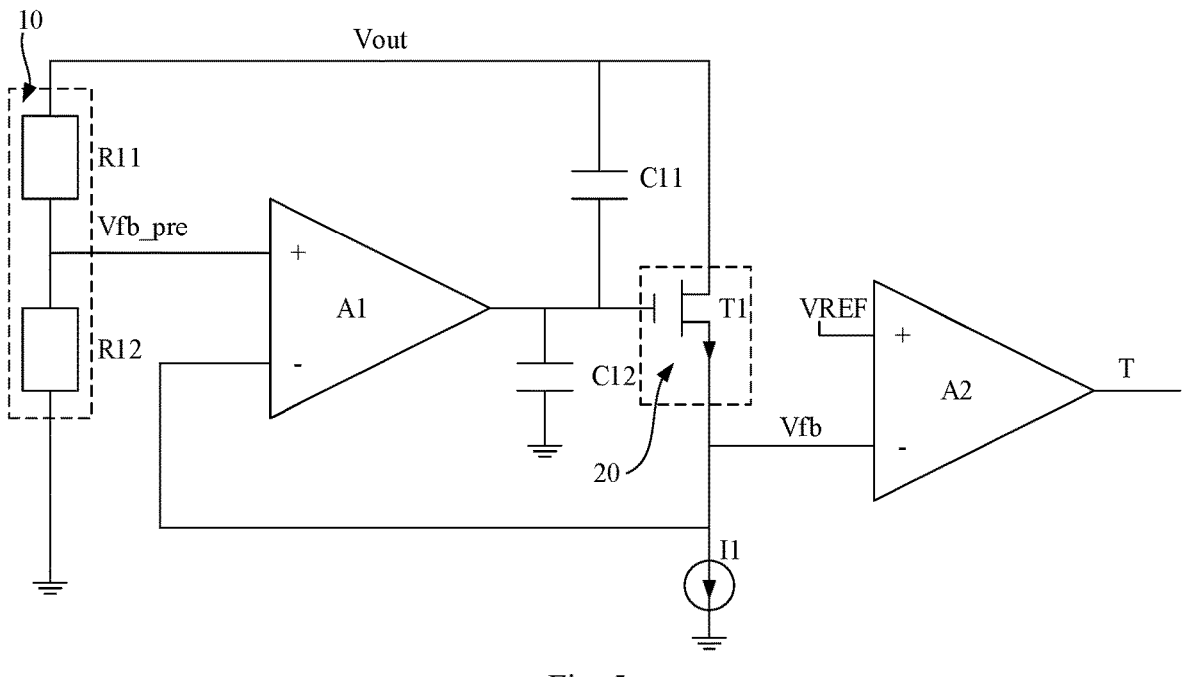
FIG. 5 is a schematic circuit diagram of a control chip according to an embodiment of the present invention.
Figure 6:
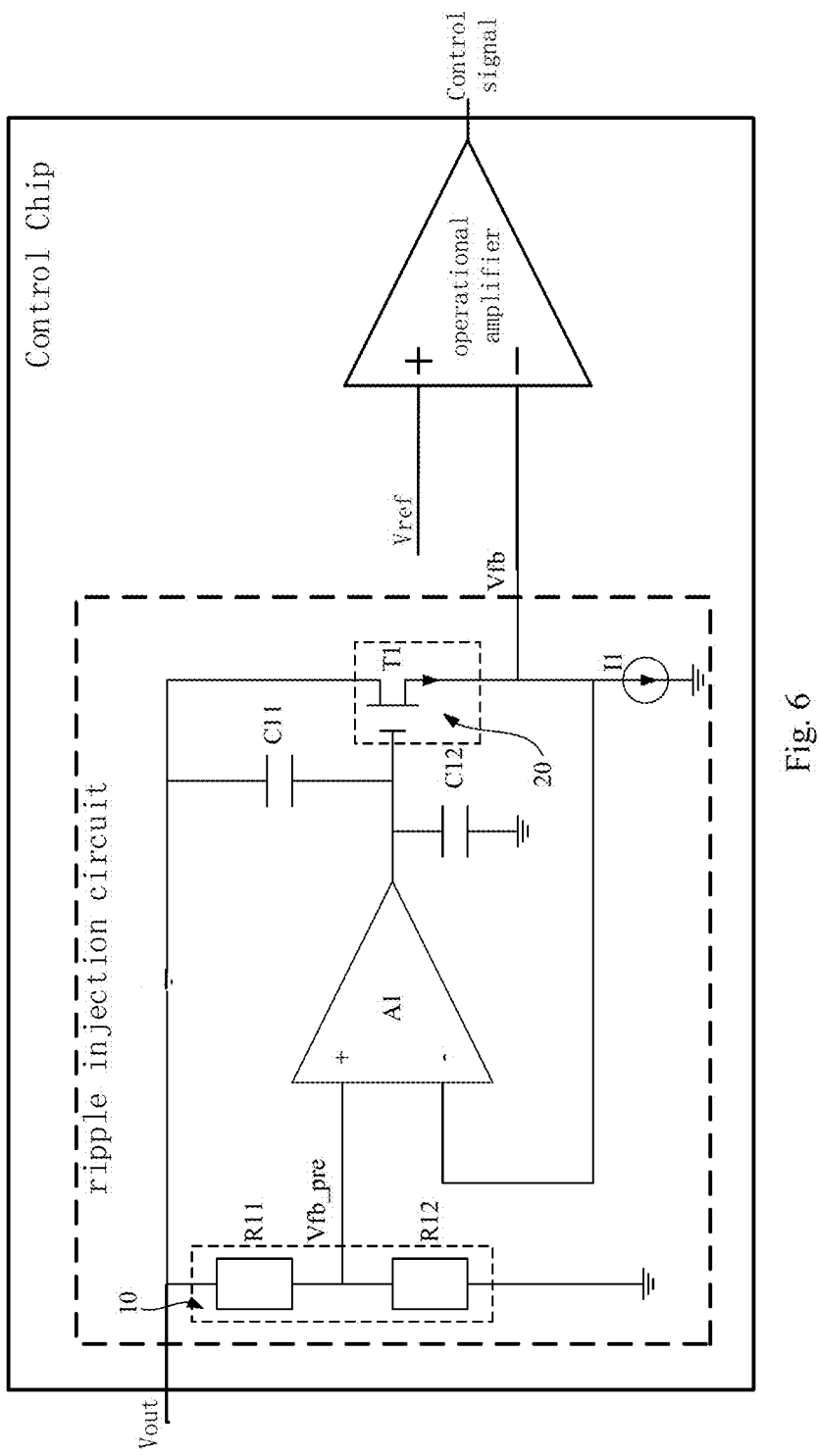
FIG. 6 is a schematic circuit diagram of a control chip.

FIG. 5 shows a control chip according to an embodiment of the present invention, which includes the built-in ripple injection circuit as described above and a second op amp A2. A first input terminal of the second op amp A2 is configured to receive a reference voltage VREF, and a second input terminal of the second op amp A2 is connected to the third terminal of the source follower 20 in order to receive the feedback voltage Vfb. The second op amp A2 is used to output a control signal T, which controls a power switch in a power supply system operating in the ripple-based COT control mode and thereby enhances stability and interference resilience of the system. The built-in ripple injection circuit dispenses with the use of a large capacitor, resulting in an area reduction. This enables it to be integrated into the control chip and satisfactorily addresses applications requiring on-chip integration of the feedback circuit, reducing the cost of the power supply system. The first and second input terminals of the second op amp A2 may be non-inverting and inverting input terminals thereof. In alternative embodiments, the first and second input terminals of the second op amp A2 may be the inverting and non-inverting input terminals thereof.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

The invention claimed is:

1. A control chip, comprising an built-in ripple injection circuit integrated within the control chip and comprising:
   a feedback circuit comprising: a first terminal for receiving an output voltage; a grounded second terminal; and an output terminal for outputting a divided feedback voltage;
   an operational amplifier comprising a first input terminal, which is connected to the output terminal of the feedback circuit and configured to receive the divided feedback voltage;
   a first capacitor comprising: a first terminal connected to the first terminal of the feedback circuit; and a second terminal, which is connected to an output terminal of the operational amplifier and configured to couple high-frequency ripple in the output voltage to the output terminal of the operational amplifier; and
   a source follower comprising: a first terminal connected to the output terminal of the operational amplifier; a second terminal connected to the first terminal of the first capacitor; and a third terminal, which is connected to a second input terminal of the operational amplifier and configured to output a feedback voltage, and
   the control chip further comprising another operational amplifier,
   the other operational amplifier comprising: a first input terminal for receiving a reference voltage; a second input terminal, which is coupled to the third terminal of the source follower and configured to receive the feedback voltage; and an output terminal for outputting a control signal.

2. The control chip of claim 1, further comprising a second capacitor, the second capacitor comprising: a first terminal connected to the output terminal of the operational amplifier; and a grounded second terminal.

3. The control chip of claim 2, wherein a ratio of a capacitance of the first capacitor to a capacitance of the second capacitor is between 1:5 and 5:1.

4. The control chip of claim 1, wherein the operational amplifier is an operational transconductance amplifier and a gain of the operational transconductance amplifier is between 10 nS and 250 nS.

5. The control chip of claim 4, wherein the gain of the operational transconductance amplifier is positively correlated with a capacitance of the first capacitor.

6. The control chip of claim 5, wherein a ratio of the gain of the operational transconductance amplifier to the capacitance of the first capacitor is between 5 nS/pF and 30 nS/pF.

7. The control chip of claim 1, wherein the feedback circuit comprises a first resistor and a second resistor, a first terminal of the first resistor connected to the first terminal of the feedback circuit, a second terminal of the first resistor and a first terminal of the second resistor both connected to the output terminal of the feedback circuit, a second terminal of the second resistor connected to the second terminal of the feedback circuit.

8. The control chip of claim 1, further comprising a current source, the current source comprising: a first terminal connected to the third terminal of the source follower; and a grounded second terminal.

9. The control chip of claim 1, wherein the operational amplifier is a folded cascode amplifier, and a negative feedback is provided at a source of the operational amplifier.

* * * * *